(12) United States Patent
Tsai et al.

(10) Patent No.: US 9,331,143 B1
(45) Date of Patent: May 3, 2016

(54) SEMICONDUCTOR STRUCTURE HAVING FIELD PLATES OVER RESURF REGIONS IN SEMICONDUCTOR SUBSTRATE

(71) Applicant: MACRONIX INTERNATIONAL CO., LTD., Hsinchu (TW)

(72) Inventors: Ying-Chieh Tsai, Chiayi (TW); Wing-Chor Chan, Hsinchu (TW); Shyi-Yuan Wu, Hsin-Chu (TW); Jeng Gong, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/548,319

(22) Filed: Nov. 20, 2014

(51) Int. Cl.
  *H01L 29/06* (2006.01)
  *H01L 29/739* (2006.01)
(52) U.S. Cl.
  CPC ........ *H01L 29/0619* (2013.01); *H01L 29/7393* (2013.01)
(58) Field of Classification Search
  CPC .................................................. H01L 29/7398
  See application file for complete search history.

(56) References Cited

U.S. PATENT DOCUMENTS

| | | | | |
|---|---|---|---|---|
| 4,901,131 A * | 2/1990 | Takahashi | ........... | H01L 29/7398 257/212 |
| 5,801,420 A * | 9/1998 | Fujishima | ........... | H01L 29/0634 257/133 |
| 6,198,130 B1 * | 3/2001 | Nobuto | ............... | H01L 29/7394 257/331 |
| 6,365,932 B1 * | 4/2002 | Kouno | ................ | H01L 27/0255 257/133 |
| 6,915,298 B1 * | 7/2005 | Cain | ................. | G06F 17/30604 |
| 2003/0218186 A1 * | 11/2003 | Hano | .................. | H01L 27/0629 257/197 |
| 2008/0012043 A1 * | 1/2008 | Udrea | ................. | H01L 29/0657 257/163 |
| 2011/0186907 A1 * | 8/2011 | Fujii | ................. | H01L 29/66325 257/132 |
| 2015/0008481 A1 * | 1/2015 | Pathirana | ............ | H01L 29/7393 257/140 |

* cited by examiner

*Primary Examiner* — Michael Jung
(74) *Attorney, Agent, or Firm* — McClure, Qualey & Rodack, LLP (57) ABSTRACT

A semiconductor structure is provided. The semiconductor structure comprises: a substrate; a first doping region, a first well and a second doping region formed in the substrate; a plurality of first heavily doped regions formed in the first doping region; a plurality of conductors and a plurality of dielectrics formed on the substrate between the first heavily doped regions; a second heavily doped region formed in the first well; a third heavily doped region and a fourth heavily doped region formed in the second doping region; as well as a first gate electrode and a first gate dielectric. The first doping region, the first well, the second heavily doped region and the fourth heavily doped region have a first type of doping. The second doping region, the first heavily doped regions and the third heavily doped region have a second type of doping.

19 Claims, 7 Drawing Sheets

SEMICONDUCTOR STRUCTURE HAVING FIELD PLATES OVER RESURF REGIONS IN SEMICONDUCTOR SUBSTRATE

TECHNICAL FIELD

The disclosure relates in general to a semiconductor structure, and more particularly to a semiconductor structure comprising an insulated gate bipolar transistor (IGBT).

BACKGROUND

High voltage power ICs have been applied in the fields of switch-mode power supply (SMPS), lighting, motor control, plasma drives, and the like. Improved efficiency, reliability and flexibility as well as reduced system level cost are pursued. Lateral IGBT are widely used in the power IC technology. Lateral IGBT combines the advantages of both double diffused metal oxide semiconductor (DMOS) and bipolar transistor, such as high input impedance and good gate control (the advantages of DMOS), as well as high current levels at low on-state voltage drop (the advantage pf bipolar transistor). In addition, lateral IGBT has lower on-state resistance (Ron) than DMOS, and thus on-state losses are reduced. Multichannel lateral IGBT, due to its additional channels, provides a reduction in forward voltage drop. Vertical IGBT has even lower on-state losses than lateral IGBT.

SUMMARY

In this disclosure, a semiconductor structure comprising an improved IGBT is provided.

According to one embodiment, a semiconductor structure comprises a substrate, a first doping region, a first well, a second doping region, a plurality of first heavily doped regions, a plurality of conductors and a plurality of dielectrics, a second heavily doped region, a third heavily doped region, a fourth heavily doped region, as well as a first gate electrode and a first gate dielectric. The first doping region is formed in the substrate. The first doping region has a first type of doping. The first well is formed in the substrate. The first well has the first type of doping. The second doping region is formed in the substrate and surrounds the first doping region. The second doping region separates the first well from the first doping region. The second doping region has a second type of doping. The first heavily doped regions are formed in the first doping region. The first heavily doped regions have the second type of doping. The conductors and the dielectrics are formed on the substrate between the first heavily doped regions. The conductors are formed on the dielectrics. The second heavily doped region is formed in the first well. The second heavily doped region has the first type of doping. The third heavily doped region is formed in the second doping region. The third heavily doped region has the second type of doping. The fourth heavily doped region is formed in the second doping region adjacent to the third heavily doped region. The fourth heavily doped region has the first type of doping. The first gate electrode and the first gate dielectric are formed on the substrate between the first heavily doped regions and the fourth heavily doped region. The first gate electrode is formed on the first gate dielectric.

According to another embodiment, a semiconductor structure comprises a substrate and an IGBT. The IGBT comprises a first doping region, a first well, a second doping region, a plurality of first heavily doped regions, a plurality of conductors and a plurality of dielectrics, a second heavily doped region, a third heavily doped region, a fourth heavily doped region, as well as a first gate electrode and a first gate dielectric. The first doping region is formed in the substrate. The first doping region has a first type of doping. The first well is formed in the substrate. The first well has the first type of doping. The second doping region is formed in the substrate and surrounds the first doping region. The second doping region separates the first well from the first doping region. The second doping region has a second type of doping. The first heavily doped regions are formed in the first doping region. The first heavily doped regions have the second type of doping. The conductors and the dielectrics are formed on the substrate between the first heavily doped regions. The conductors are formed on the dielectrics. The second heavily doped region is formed in the first well. The second heavily doped region has the first type of doping. The third heavily doped region is formed in the second doping region. The third heavily doped region has the second type of doping. The fourth heavily doped region is formed in the second doping region adjacent to the third heavily doped region. The fourth heavily doped region has the first type of doping. The first gate electrode and the first gate dielectric are formed on the substrate between the first heavily doped regions and the fourth heavily doped region. The first gate electrode is formed on the first gate dielectric. The first heavily doped regions and the second heavily doped region are electrically connected and used as an anode of the IGBT, and the third heavily doped region and the fourth heavily doped region are electrically connected and used as a cathode of the IGBT.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1:
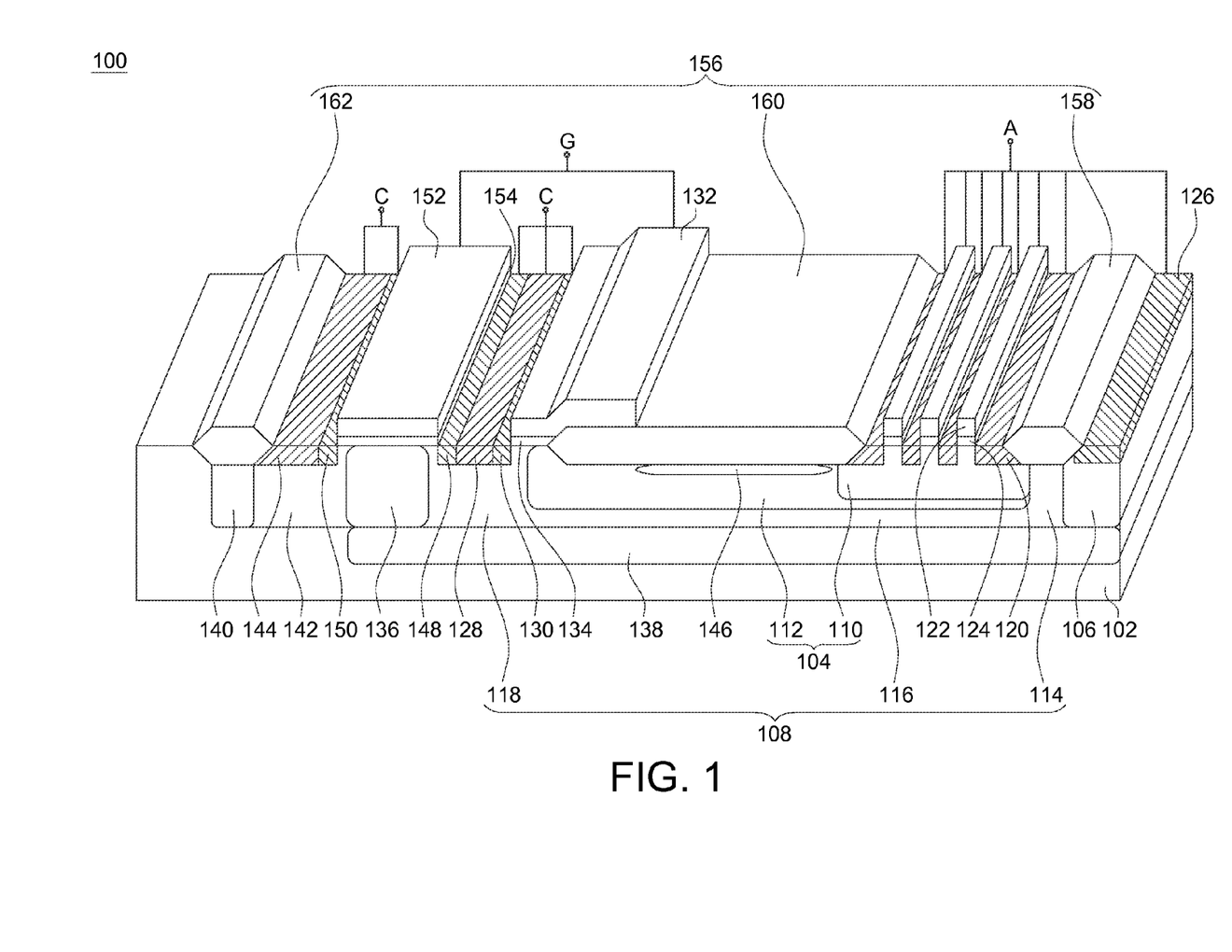
FIG. 1 and FIG. 2 show a semiconductor structure according to one embodiment.

Referring to FIG. 1, a semiconductor structure 100 according to one embodiment is shown. The semiconductor structure 100 comprises a substrate 102, a first doping region 104, a first well 106, a second doping region 108, a plurality of first heavily doped regions 120, a plurality of conductors 122 and a plurality of dielectrics 124, a second heavily doped region 126, a third heavily doped region 128, a fourth heavily doped region 130, as well as a first gate electrode 132 and a first gate dielectric 134.

The first doping region 104 is formed in the substrate 102. The first doping region 104 may comprise a second well 110 and a third well 112. The third well 112 is adjacent to and extending under the second well 110. The doping concentration of the second well 110 is higher than the doping concentration of the third well 112. The first well 106 is formed in the substrate 102. The second doping region 108 is formed in the substrate 102 and surrounds the first doping region 104. The second doping region 108 separates the first well 106 from the first doping region 104. The second doping region 108 may comprise a fourth well 114, a first buried layer 116 and a fifth well 118. The fourth well 114 separates the first well 106 from the first doping region 104. The fifth well 118 is separated from the fourth well 114. The first buried layer 116 connects the fourth well 114 and the fifth well 118.

The first heavily doped regions 120 are formed in the first doping region 104. More specifically, the first heavily doped regions 120 are formed in the second well 110. The second heavily doped region 126 is formed in the first well 106. The third heavily doped region 128 is formed in the second doping region 108. The fourth heavily doped region 130 is formed in the second doping region 108 adjacent to the third heavily doped region 128. More specifically, the third heavily doped region 128 and the fourth heavily doped region 130 are formed in the fifth well 118.

The first doping region 104, the first well 106, the second heavily doped region 126 and the fourth heavily doped region 130 have a first type of doping. The second doping region 108, the first heavily doped regions 120 and the third heavily doped region 128 have a second type of doping. The substrate 102 may have the second type of doping. The first type of doping may be n-type, and the second type of doping may be p-type. According to one embodiment, the first well 106 and the third well 112 may be high voltage n-type wells, the second well 110 may be a n-well, the fourth well 114 and the fifth well 118 may be high voltage deep p-type wells, and the first buried layer 116 may be a p-type buried layer.

In one embodiment, the doping concentration of the first well 106 is $10^{12}$ to $10^{13}$ cm$^{-2}$, the doping concentration of the second well 110 is $10^{13}$ to $10^{15}$ cm$^{-2}$, the doping concentration of the third well 112 is $10^{12}$ to $10^{13}$ cm$^{-2}$, the doping concentration of the fourth well 114 is $10^{12}$ to $10^{13}$ cm$^{-2}$, the doping concentration of the fifth well 118 is $10^{12}$ to $10^{13}$ cm$^{-2}$, the doping concentration of the first buried layer 116 is $10^{12}$ to $10^{14}$ cm$^{-2}$, the doping concentrations of the first heavily doped regions 120 are $10^{14}$ to $10^{15}$ cm$^{-2}$, the doping concentration of the second heavily doped region 126 is $10^{14}$ to $10^{15}$ cm$^{-2}$, the doping concentration of the third heavily doped region 128 is $10^{14}$ to $10^{15}$ cm$^{-2}$, and the doping concentration of the fourth heavily doped region 130 is $10^{14}$ to $10^{15}$ cm$^{-2}$.

The conductors 122 and the dielectrics 124 are formed on the substrate 102 between the first heavily doped regions 120. The conductors 122 are formed on the dielectrics 124. The conductors 122 may be formed of poly-silicon, metal, poly-silicide, or the like.

The first gate electrode 132 and the first gate dielectric 134 are formed on the substrate 102 between the first heavily doped regions 120 and the fourth heavily doped region 130. The first gate electrode 132 is formed on the first gate dielectric 134. The first gate electrode 132 may be formed of poly-silicon, metal, poly-silicide, or the like.

The first doping region 104, the first well 106, the second doping region 108, the first heavily doped regions 120, the conductors 122 and the dielectrics 124, the second heavily doped region 126, the third heavily doped region 128, the fourth heavily doped region 130, as well as the first gate electrode 132 and the first gate dielectric 134 may constitute an IGBT, more specifically, a junction-isolated lateral IGBT. At this time, the first heavily doped regions 120 and the second heavily doped region 126 are electrically connected and used as an anode of the IGBT, and the third heavily doped region 128 and the fourth heavily doped region 130 are electrically connected and used as a cathode of the IGBT.

Figure 2:
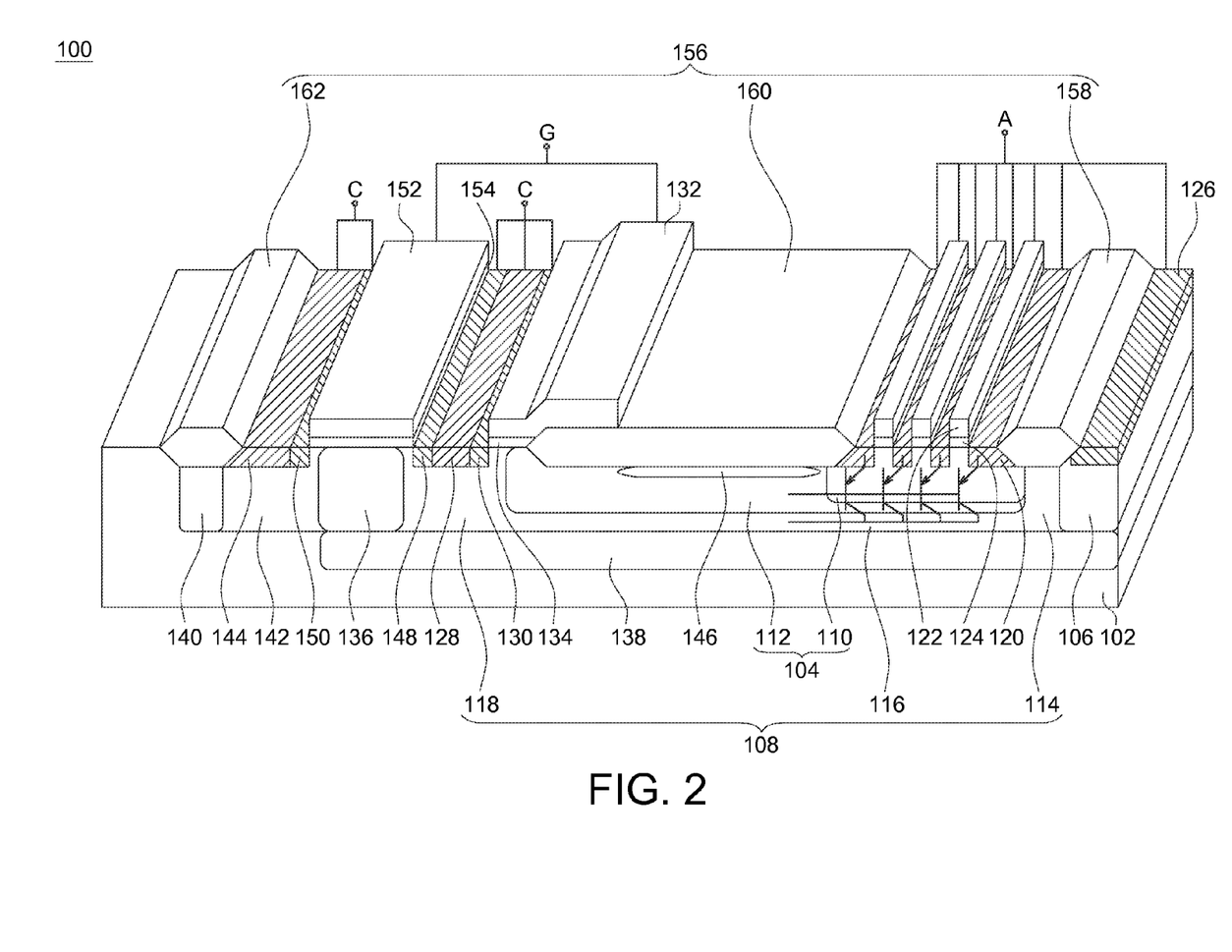

The first heavily doped regions 120 and the second well 110 may constitute a plurality of parasitic PNP BJT, as shown in FIG. 2. As such, the current contributed by hole is increased, and thus the total current may be increased, and the on-state resistance is decreased. In addition, the conductors 122 assist the current distribution. By such a structure, the specific on-state resistance (Ron,sp) and BVdss characteristics are improved. Further, the substrate current is suppressed.

The semiconductor structure 100 may further comprise a sixth well 136. The sixth well 136 is formed in the substrate 102 adjacent to the fifth well 118. The sixth well 136 has the first type of doping. The sixth well 136 may be a high voltage n-type well. The semiconductor structure 100 may further comprise a second buried layer 138. The second buried layer 138 connects the first well 106 and the sixth well 136. The second buried layer 138 has the first type of doping. The second buried layer 138 may be a n-type buried layer. In one embodiment, the doping concentration of the sixth well 136 is $10^{12}$ to $10^{13}$ cm$^{-2}$, and the doping concentration of the second buried layer 138 is $10^{12}$ to $10^{14}$ cm$^{-2}$. The second buried layer 138 connects the fourth well 114 and the sixth well 136, thereby forms a current passage and suppresses substrate current.

The semiconductor structure 100 may further comprise a seventh well 140, an eighth well 142 and a fifth heavily doped region 144. The seventh well 140 is formed in the substrate 102. The seventh well 140 has the first type of doping. The seventh well 140 may be a high voltage n-type well. The eighth well 142 is formed in the substrate 102 between the sixth well 136 and the seventh well 140. The eighth well 142 has the second type of doping. The eighth well 142 may be a high voltage p-type deep well. The fifth heavily doped region 144 is formed in the eighth well 142. The fifth heavily doped region 144 has the second type of doping. In one embodiment, the doping concentration of the seventh well 140 is $10^{12}$ to $10^{13}$ cm$^{-2}$, the doping concentration of the eighth well 142 is $10^{12}$ to $10^{13}$ cm$^{-2}$, and the doping concentration of the fifth heavily doped region 144 is $10^{14}$ to $10^{15}$ cm$^{-2}$. The semiconductor structure 100 may further comprise a doping layer 146. The doping layer 146 is formed in the third well 112. The doping layer 146 may be a p-top layer.

The semiconductor structure 100 may further comprise a sixth heavily doped region 148, a seventh heavily doped region 150, as well as a second gate electrode 152 and a second gate dielectric 154. The sixth heavily doped region 148 is formed in the fifth well 118 adjacent to the third heavily doped region 128. The sixth heavily doped region 148 has the first type of doping. The seventh heavily doped region 150 is formed in the eighth well 142 adjacent to the fifth heavily doped region 144. The seventh heavily doped region 150 has the first type of doping. The second gate electrode 152 and the second gate dielectric 154 are formed on the substrate 102 between the sixth heavily doped region 148 and the seventh heavily doped region 150. The second gate electrode 152 is formed on the second gate dielectric 154. The second gate electrode 152 may be formed of poly-silicon, metal, poly-silicide, or the like. In one embodiment, the doping concentration of the sixth heavily doped region 148 is $10^{14}$ to $10^{15}$ cm$^{-2}$, and the doping concentration of the seventh heavily doped region 150 is $10^{14}$ to $10^{15}$ cm$^{-2}$. The sixth heavily doped region 148, the seventh heavily doped region 150 as well as the second gate electrode 152 and the second gate dielectric 154 may constitute a DMOS. The DMOS is connected to the sixth well 136 and further connected to the first well 106, which is a part of the anode. As such, the anode current is further increased, and the substrate current is further suppressed.

The semiconductor structure 100 may further comprise a field oxide layer 156. The field oxide layer 156 is formed on the substrate 102. The field oxide layer 156 comprises a first field oxide 158, a second field oxide 160 and a third field oxide 162. The first field oxide 158 is formed on the fourth well 114. The second field oxide 160 is formed on the third well 112. A portion of the first gate electrode 132 is formed on the second field oxide 160. The third field oxide 162 is formed on the seventh well 140. While the field oxide layer 156 is illustrated in the figures, other isolation means, such as shallow trench isolation (STI), deep trench isolation (DTI) or the like, may be applied.

Figure 3:
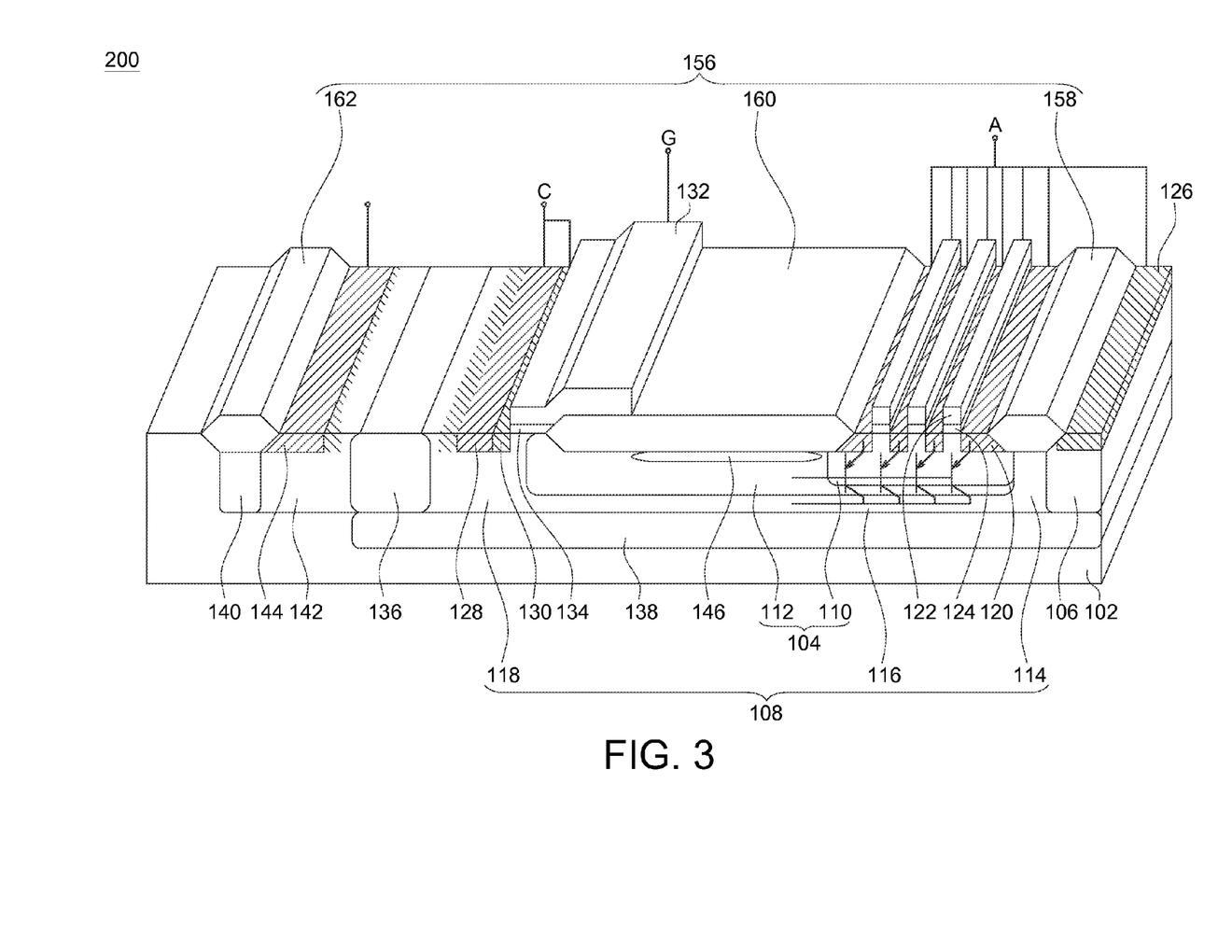
FIG. 3 shows a semiconductor structure according to one embodiment.

Referring to FIG. 3, a semiconductor structure 200 according to one embodiment is shown. The difference between the semiconductor structure 200 and the semiconductor structure 100 is that, in the semiconductor structure 200, there is no DMOS structure. In other words, the sixth heavily doped region 148, the seventh heavily doped region 150 as well as the second gate electrode 152 and the second gate dielectric 154 are not existent in the semiconductor structure 200.

Figure 4:
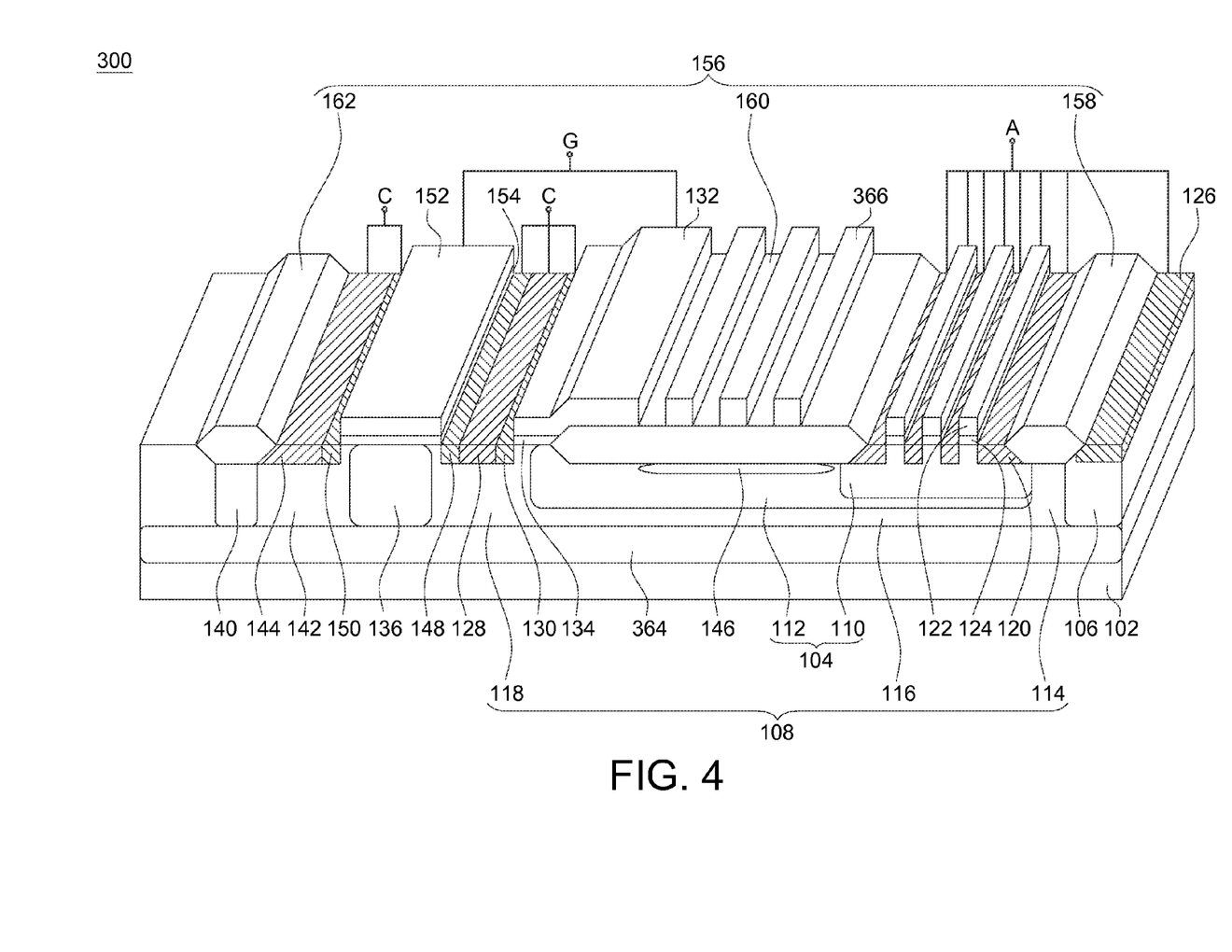
FIG. 4 shows a semiconductor structure according to one embodiment.

Referring to FIG. 4, a semiconductor structure 300 according to one embodiment is shown. In the semiconductor structure 300, the second buried layer 138 is not existent. The semiconductor structure 300 may be manufactured by a silicon-on-insulator (SOI) process, and comprises a buried oxide layer 364. The buried oxide layer 364 is a formed under the first well 106, the first doping region 104, the second doping region 108 and the sixth well 136. Further, the semiconductor structure 300 comprises a plurality of field plates 366. The field plates 366 are formed on the second field oxide 160 in the drift region of the semiconductor structure 300, and thus a reduced surface field (RESURF) structure is provided in the semiconductor structure 300. The field plates 366 may be formed of poly-silicon.

The manufacturing of a semiconductor structure according to this disclosure may apply the widely-used process, such as local oxidation of silicon (LOCOS) process, SOI process, epitaxial process, non-epitaxial process, STI process, DTI process, or the like. As such, the manufacturing of a semiconductor structure according to this disclosure is compatible with the manufacturing of other devices, such as a 700 V power CMOS.

Figure 5:
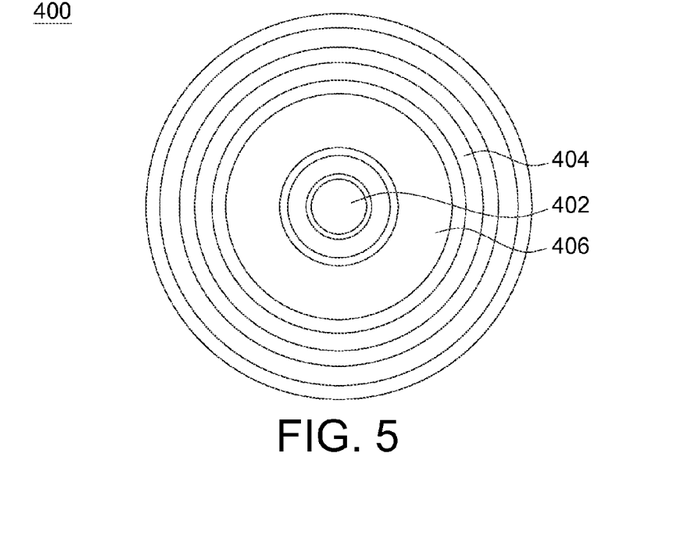
FIG. 5 shows a semiconductor structure according to one embodiment.

While the forgoing embodiments illustrate a rectangular arrangement, a semiconductor structure according to this disclosure may have other arrangements, such as hexagonal, octagonal, circular, runway-shape, or the like. A circular example is shown in FIG. 5. The semiconductor structure 400 comprising an anode 402, a cathode 404 and a gate 406 is shown.

Figure 6:
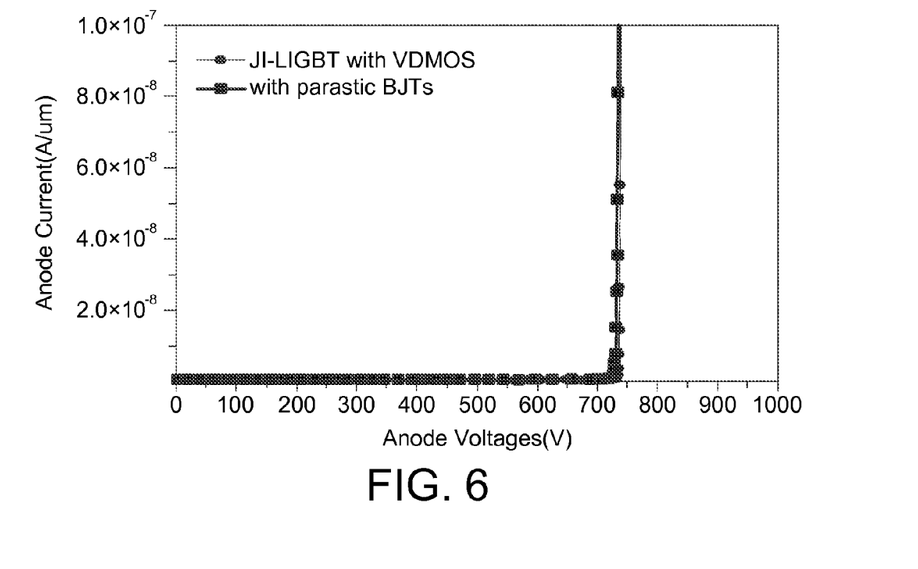
FIG. 6 to FIG. 8 show characteristics of examples according to this disclosure and comparative examples thereof.
Figure 7:
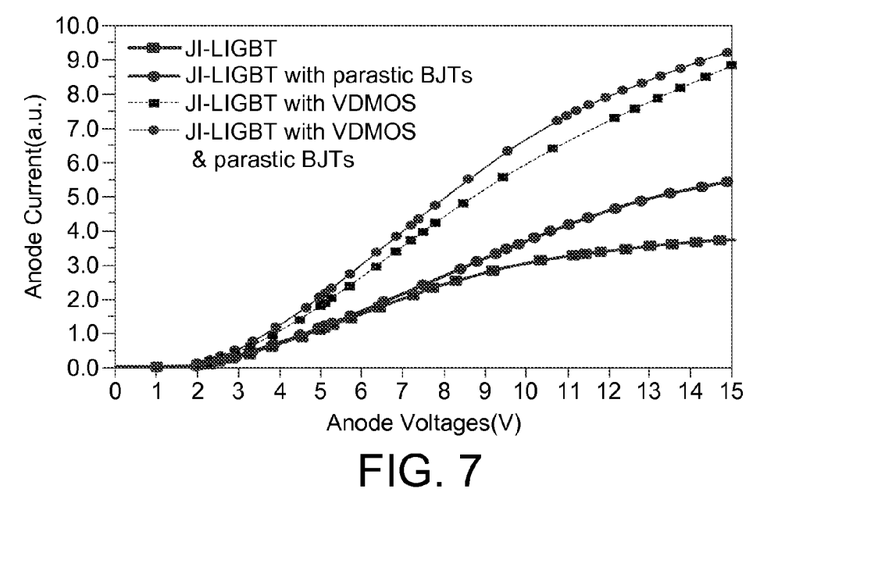
Figure 8:
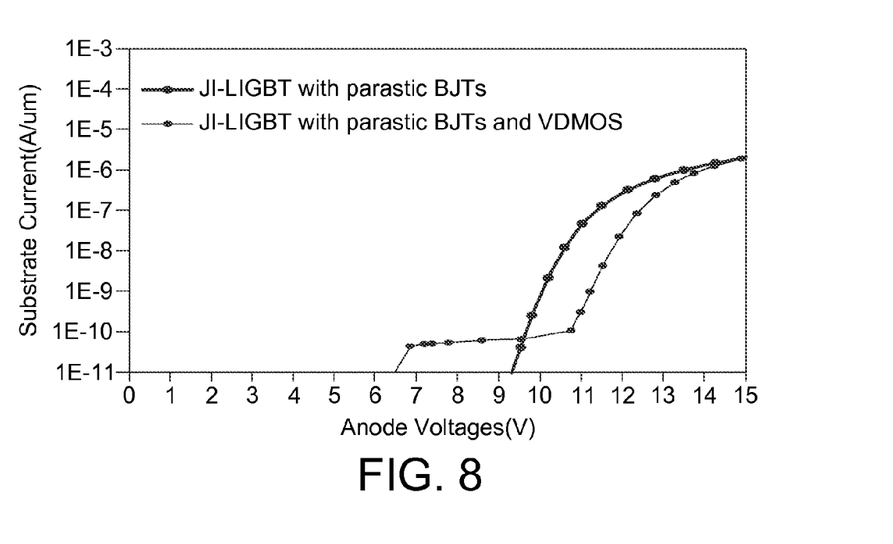

Now referring to FIG. 6 to FIG. 8, characteristics of examples according to this disclosure and comparative examples thereof are shown. As shown in FIG. 6, the example according to this disclosure may be applied in a condition that a breakdown voltage higher than 700 V is needed. As shown in FIG. 7, the anode currents of the examples according to this disclosure are further increased. As shown in FIG. 8, up to a 15 V anode voltage, the substrate current is lower than about $10^{-6}$ A/um.

Figure 9:
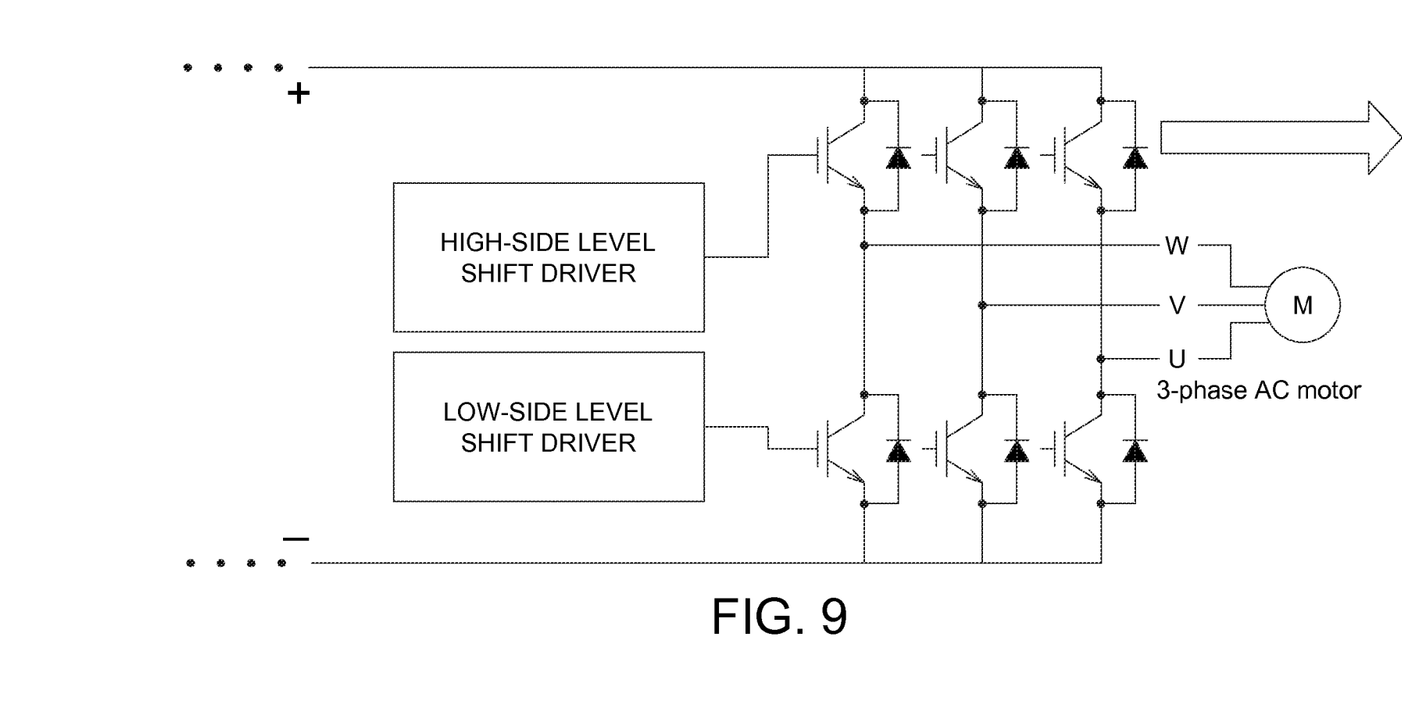
FIG. 9 shows an application of a semiconductor structure according to one embodiment.

In the semiconductor structure according to this disclosure, due to the setting of the parasitic BJT structure, the Ron,sp can be decreased, and thus the on-state losses can be reduced considerably. Further, lower turn-on voltage may be obtained. For example, in the condition that Vgs>Vth, Vds may be 0 V. Such a semiconductor structure may be applied in the motor driver, as shown in FIG. 9, either in a half-bridge circuit or in a full-bridge circuit. Alternatively, the semiconductor structure may be applied in a LED driver, a current driver, or the like.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
   a substrate;
   a first doping region formed in the substrate, the first doping region having a first type of doping, the first doping region comprising:
   a second well; and
   a third well adjacent to and extending under the second well;
   a first well formed in the substrate, the first well having the first type of doping;
   a second doping region formed in the substrate and surrounding the first doping region, the second doping region separating the first well from the first doping region, the second doping region having a second type of doping, the second doping region comprising:
   a fourth well separating the first well from the first doping region;
   a fifth well separated from the fourth well; and
   a first buried layer connecting the fourth well and the fifth well;
   a plurality of first heavily doped regions formed in the second well of the first doping region, the first heavily doped regions having the second type of doping;
   a plurality of conductors and a plurality of dielectrics formed on the substrate between the first heavily doped regions, wherein the conductors are formed on the dielectrics;
   a second heavily doped region formed in the first well, the second heavily doped region having the first type of doping;
   a third heavily doped region formed in the fifth well of the second doping region, the third heavily doped region having the second type of doping;
   a fourth heavily doped region formed in the fifth well of the second doping region adjacent to the third heavily doped region, the fourth heavily doped region having the first type of doping; and
   a first gate electrode and a first gate dielectric formed on the substrate between the first heavily doped regions and the fourth heavily doped region, wherein the first gate electrode is formed on the first gate dielectric.

2. The semiconductor structure according to claim 1, wherein the doping concentration of the second well is higher than the doping concentration of the third well.

3. The semiconductor structure according to claim 1, wherein the doping concentration of the first well is $10^{12}$ to $10^{13}$ cm$^{-2}$, the doping concentration of the second well is $10^{13}$ to $10^{15}$ cm$^{-2}$, the doping concentration of the third well is $10^{12}$ to $10^{13}$ cm$^{-2}$, the doping concentration of the fourth well is $10^{12}$ to $10^{13}$ cm$^{-2}$, the doping concentration of the fifth well is $10^{12}$ to $10^{13}$ cm$^{-2}$, the doping concentration of the first buried layer is $10^{12}$ to $10^{14}$ cm$^{-2}$, the doping concentrations of the first heavily doped regions are $10^{14}$ to $10^{15}$ cm$^{-2}$, the doping concentration of the second heavily doped region is $10^{14}$ to $10^{15}$ cm$^{-2}$, the doping concentration of the third heavily doped region is $10^{14}$ to $10^{15}$ cm$^{-2}$, and the doping concentration of the fourth heavily doped region is $10^{14}$ to $10^{15}$ cm$^{-2}$.

4. The semiconductor structure according to claim 1, further comprising:
a sixth well formed in the substrate adjacent to the fifth well, the sixth well having the first type of doping.

5. The semiconductor structure according to claim 4, further comprising:
a second buried layer connecting the first well and the sixth well, the second buried layer having the first type of doping.

6. The semiconductor structure according to claim 5, wherein the doping concentration of the sixth well is $10^{12}$ to $10^{13}$ cm$^{-2}$, and the doping concentration of the second buried layer is $10^{12}$ to $10^{14}$ cm$^{-2}$.

7. The semiconductor structure according to claim 4, further comprising:
a seventh well formed in the substrate, the seventh well having the first type of doping;
an eighth well formed in the substrate between the sixth well and the seventh well, the eighth well having the second type of doping; and
a fifth heavily doped region formed in the eighth well, the fifth heavily doped region having the second type of doping.

8. The semiconductor structure according to claim 7, wherein the doping concentration of the seventh well is $10^{12}$ to $10^{13}$ cm$^{-2}$, the doping concentration of the eighth well is $10^{12}$ to $10^{13}$ cm$^{-2}$, and the doping concentration of the fifth heavily doped region is $10^{14}$ to $10^{15}$ cm$^{-2}$.

9. The semiconductor structure according to claim 7, further comprising:
a sixth heavily doped region formed in the fifth well adjacent to the third heavily doped region, the sixth heavily doped region having the first type of doping;
a seventh heavily doped region formed in the eighth well adjacent to the fifth heavily doped region, the seventh heavily doped region having the first type of doping; and
a second gate electrode and a second gate dielectric formed on the substrate between the sixth heavily doped region and the seventh heavily doped region, wherein the second gate electrode is formed on the second gate dielectric.

10. The semiconductor structure according to claim 9, wherein the doping concentration of the sixth heavily doped region is $10^{14}$ to $10^{15}$ cm$^{-2}$, and the doping concentration of the seventh heavily doped region is $10^{14}$ to $10^{15}$ cm$^{-2}$.

11. The semiconductor structure according to claim 4, further comprising:
a buried oxide layer formed under the first well, the first doping region, the second doping region and the sixth well.

12. The semiconductor structure according to claim 1, further comprising:
a doping layer formed in the third well.

13. The semiconductor structure according to claim 1, further comprising:
a field oxide layer formed on the substrate, the field oxide layer comprising:
a first field oxide formed on the fourth well; and
a second field oxide formed on the third well, wherein a portion of the first gate electrode is formed on the second field oxide.

14. The semiconductor structure according to claim 13, further comprising:
a plurality of field plates formed on the second field oxide.

15. The semiconductor structure according to claim 13, wherein the field plates are formed of poly-silicon.

16. The semiconductor structure according to claim 1, wherein the conductors are formed of poly-silicon, metal or poly-silicide.

17. The semiconductor structure according to claim 1, wherein the first type of doping is n-type, and the second type of doping is p-type.

18. A semiconductor structure, comprising:
a substrate; and
an insulated gate bipolar transistor (IGBT), comprising:
a first doping region formed in the substrate, the first doping region having a first type of doping;
a first well formed in the substrate, the first well having the first type of doping;
a second doping region formed in the substrate and surrounding the first doping region, the second doping region separating the first well from the first doping region, the second doping region having a second type of doping;
a plurality of first heavily doped regions formed in the first doping region, the first heavily doped regions having the second type of doping;
a plurality of conductors and a plurality of dielectrics formed on the substrate between the first heavily doped regions, wherein the conductors are formed on the dielectrics;
a second heavily doped region formed in the first well, the second heavily doped region having the first type of doping;
a third heavily doped region formed in the second doping region, the third heavily doped region having the second type of doping;
a fourth heavily doped region formed in the second doping region adjacent to the third heavily doped region, the fourth heavily doped region having the first type of doping; and
a first gate electrode and a first gate dielectric formed on the substrate between the first heavily doped regions and the fourth heavily doped region, wherein the first gate electrode is formed on the first gate dielectric;
wherein the first heavily doped regions and the second heavily doped region are electrically connected and used as an anode of the IGBT, and the third heavily doped region and the fourth heavily doped region are electrically connected and used as a cathode of the IGBT.

19. The semiconductor structure according to claim 18, wherein the first doping region comprising:
a second well, wherein the first heavily doped regions are formed in the second well; and
a third well adjacent to and extending under the second well; and
wherein the second doping region comprising:
a fourth well separating the first well from the first doping region;
a fifth well separated from the fourth well, wherein the third heavily doped region and the fourth heavily doped region are formed in the fifth well; and
a first buried layer connecting the fourth well and the fifth well.

* * * * *